United States Patent [19]

Voinis et al.

[11] Patent Number: 4,822,536
[45] Date of Patent: Apr. 18, 1989

[54] METHOD OF ENCAPSULATING AN ELECTRONIC COMPONENT WITH A SYNTHETIC RESIN

[75] Inventors: Sylvie Voinis, St. Germain-en-Laye; Sjoerd Nijboer, Carrieres-sur-Seine, both of France

[73] Assignee: U.S. Philips Corporation, New York, N.Y.

[21] Appl. No.: 944,289

[22] Filed: Dec. 18, 1986

[30] Foreign Application Priority Data

Dec. 20, 1985 [FR] France ................. 85 18922

[51] Int. Cl.⁴ ............... B29C 35/08; B29C 43/28
[52] U.S. Cl. ................. 264/22; 264/1.4; 264/272.17; 437/211
[58] Field of Search .......... 264/1.4, 22, 272.16, 264/272.17; 29/588; 522/181; 437/207, 217, 219

[56] References Cited

U.S. PATENT DOCUMENTS

| | | | |
|---|---|---|---|
| 4,034,466 | 7/1977 | Thome | 29/588 |
| 4,203,792 | 5/1980 | Thompson | 29/588 |
| 4,477,328 | 10/1984 | Broeksema et al. | 522/14 |

FOREIGN PATENT DOCUMENTS 60-9663 3/1985 Japan.

Primary Examiner—James Lowe
Attorney, Agent, or Firm—Norman N. Spain

[57] ABSTRACT

A method using one or several successive coatings of an active device (63), (64) by means of a synthetic resin (72);

the resin used is on the basis of a product of the family of ethoxy bisphenol A dimethacrylates, to which is added a photo-initiator compound producing radicals by photo-scission or by intermolecular abstraction of hydrogen at a concentration lying between 0.2 and 3% and preferably near 1%, which is then irradiated by ultra-violet radiation (76), as the case may be through a transparent mould (70);

Application: coating of semiconductor devices and more particularly optoelectronic devices.

6 Claims, 2 Drawing Sheets

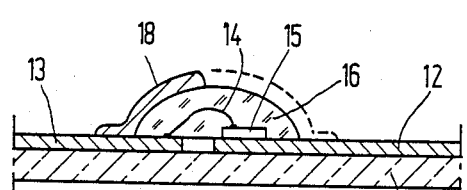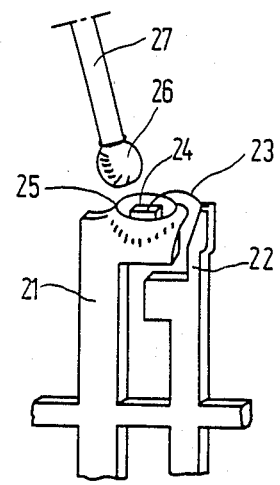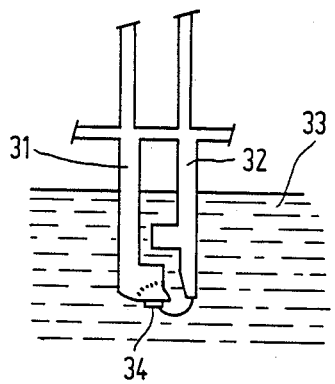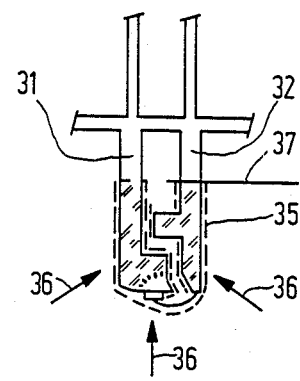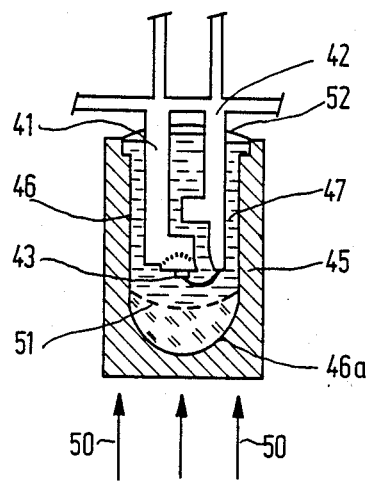
FIG.1
FIG.2
FIG.3a
FIG.3b
FIG.4

METHOD OF ENCAPSULATING AN ELECTRONIC COMPONENT WITH A SYNTHETIC RESIN

BACKGROUND OF THE INVENTION

The invention relates to a method of encapsulating an electronic component consisting in that, after having fixed and electrically connected an active device to metallic conductors, at least one coating step is carried out by means of a synthetic resin, the conductors emerging partly from this coating.

The large majority of the electronic components and more particularly the semiconductor components require a protection of the active element, which could not operate satisfactorily while being continuously exposed to a non-controlled environment. Thus, the components generally comprise a protection envelope, which also permits of providing a standarized arrangement of the conductors in the form of output pins having dimensions and relative distances chosen among standardized values.

In certain cases, it is ensured that the electronic components are encapsulated in envelopes of the metallic and/or ceramic type, while these envelopes can be closed by the use of electric soldering, brazing or soft glass fusion. However, the techniques of this type are necessarily expensive so that they are rather reserved for products which must be capable of resisting very heavy environmental loads.

In the other cases, more generally use can be made of methods of encapsulation in which a step of coating with a synthetic resin is carried out and which consists most frequently in that the resin is moulded around the active component which resin constitutes after solidification the envelope of the component, of which the conductors partly enclosed by the resin emerge, however, to the exterior with respect to the subsequent electrical connection.

Apart from the optoelectronic components, the semiconductor devices have to be protected from the ambient light in order to avoid the production of undesirable photo-currents during operation. Therefore, these devices require an encapsulation by a resin opaque to light.

On the contrary, the optoelectronic devices, such as light-emitting diodes, photodiodes, phototransistors and photocouplers, require an encapsulation which is at least partly transparent to the radiation for which the device is designed to operate, either with respect to the exterior of the envelope of solely in the internal part of the device, in which an optical coupling is obtained (case of photocouplers).

SUMMARY OF THE INVENTION

The invention has for its object to provide an encapsulation method as described in the opening paragraph, more particularly when it is applied to an optoelectronic device, in which the encapsulation is effected in a single step or in several steps according to the method known from U.S. Pat. No. 4,034,466.

It clearly appears from this patent that a specific requirement of the coating of light-emitting diodes and other optoelectronic components is added to the general requirements, i.e. the requirement with regard to the integrity of the optical properties of the surface of the coating, which integrity has to be maintained under all circumstances occurring and during the step of soldering the components and of rinsing them in certain solvents used for this purpose.

A requirement of the same order relates to the ageing of the resins, for example under the influence of the exposure to light, which resins in this case must not exhibit any yellowing resulting in a loss of optical transmission.

The invention provides a method of encapsulation which permits of solving at least to a great extent the difficulties mentioned with respect to optoelectronic devices.

More generally, however, the invention has also for its object to provide the encapsulation of any electronic component in a simple and economical manner.

In fact, according to the invention a method of encapsulating an electronic component is characterized in that as a polymerizable component is used comprising an ethoxy bisphenol A dimethacrylates and a photo-initiator constituent which produces radicals by photo-scission or by intermolecular abstraction of hydrogen at a concentration lying between 0.2 and 3% by weight, and in that the polymerizable composition is then irradiated with ultraviolet radiation to obtain the polymerization of the coating.

Among a great number of photopolymerizable materials susceptible to be used in an encapsulation method, those of the ethoxybisphenol A dimethacrylates have proved most advantageous, especially due to the fact that on the one hand they are sufficiently fluid to be used without a reactive diluting agent (monomer), which reduces the contraction effect during the polymerization, and that on the other hand they have optical properties and a chemical stability which are remarkable.

According to the method based on the photo-polymerization, a considerable increase in temperature of the product is not necessary to obtain the polymerization of the resin; on the contrary, any substantial increase in temperature can be avoided. Thus, the loads of thermal origin within the finished product are avoided. Moreover, the stability of the mixtures of resin and photo-initiator before use permits of obtaining a high comfort in use for screening from progressive variations in viscosity, such as are observed with mixtures of known use that are thermoactivable.

It is simply sufficient to avoid an exposure of the mixture to an ambient light containing a substantial quantity of ultraviolet rays.

Apart from secondary additives, such as adhesion agents, for example, that may be incorporated at a low dose to the indicated resin, a photo-initiator constituent of the type mentioned is added to the basic resin at the concentration chosen between 0.2 and 3%.

This permits of obtaining in volume a favourable polymerization of the resin, while concentrations which are just higher (10 to 25%) are recommended with regard to known applications of the photopolymerizable resins for obtaining comparatively thin films, such as protective or decorative varnishes or printing inks.

Finally, the basic resin chosen has an excellent chemical neutrality and remains stable especially with respect to the ambient subsequent degradations of the encapsulated devices.

According to a particular embodiment of the invention, in which the process of encapsulation comprises a step of precoating applied directly to the active device and a final coating step producing the external part of the encapsulation within which the volume of precoating is included, the coating method is characterized in that for the precoating step use is made of a basic resin of the same nature as that used for the final coating, in which is irradiated with ultraviolet radiation before the final coating step is carried out.

Although this deviates from the admitted practice, in which it would be preferable to carry out the precoating step with a resin must less rigid than that used for the final coating, this embodiment has yielded very good results, which are due to the good adhesion of the successive coatings, to each other and to the absence of expansion loads which can be obtained in the case of the known technique.

Moreover, the absence of a difference between the refractive indices of the two coatings suppresses the difficulty caused by the corresponding diopter.

When a mould is used to obtain an external part of the encapsulation which is of reproducible and controlled shape at least at certain specific parts of its contour, the method according to the invention is further characterized in that a mould is used having walls practically transparent to ultraviolet light, and in that, after having fixed in suitable respective positions the device provided with its conductors and the mould provided with a suitable quantity of resin, the resin is irradiated with ultraviolet radiation through the mould in a preferential direction chosen so as to initiate the polymerization and the external contour portion of the encapsulation, whose shape should be regarded with the highest possible fidelity, which conditions are maintained so that a front of progressive polymerization is displaced within the resin by translation in the sense of the said preferential direction.

When proceeding in this manner, the resin part still in the liquid state can compensate at each instant for the deficiency of substance due to the contraction subsequent to the polymerization. The risk of substance of the wall of the mould being detached is avoided and the traction loads within the plastic encapsulation is limited to a minimum. The external contour portion of the encapsulation, whose shape should be regarded with the highest possible fidelity, polymerizes first. In accordance with this portion, the contraction due to the polymerization will have the least influence.

Thus, in the case of the encapsulation of light-emitting diodes, by choosing a direction of irradiation with ultraviolet radiation striking the optical dome of the diode in the optical axis of the crystal, experience has shown that after moulding, this dome corresponded perfectly to the contour of the mould and the optical performances of the diodes were very reproducible.

If desired, according to the invention, a comparatively this film of photopolymerizable resin of the same kind as that used for the final coating step may further be applied before this step to the device and the parts of the conductors which will also be subsequently covered with the final coating; the said film is then irradiated with ultraviolet radiation until the latter is completely polymerized before the final coating step is effected. This application of a resin flim may be effected, for example, by curing.

This complementary step improves the adhesion of the encapsulation around the metallic conductors and eliminates practically the risk of infiltration of moisture or other corrosive species along the interface of conductor and resin. This interface is in fact recognized as one of the weak points of the encapsulation by synthetic resin.

Otherwise, it has been found that the adhesion of the film to the resin of the final coating was excellent so that no discontinuity of the final component thus encapsulated could be found.

The invention further has for its object to utilize the method mentioned above for coating the optoelectronic semiconductor devices and more particularly of light-emitting diodes.

BRIEF DESCRIPTION OF THE DRAWING

FIG. 1 is a sectional view of an electronic semiconductor component provided with an encapsulation obtained by the method according to the invention, FIG. 2 shows a step or precoating a light-emitting diode provided with a reflecting cavity by means of a method according to the invention, FIGS. 3A and 3B illustrate a preliminary step before the final coating step, which can be used in the method according to the invention, FIG. 4 shows the step of final coating with the use of a mould in the case of a light-emitting diode.

DETAILED DESCRIPTION OF THE INVENTION

Figure 5A:
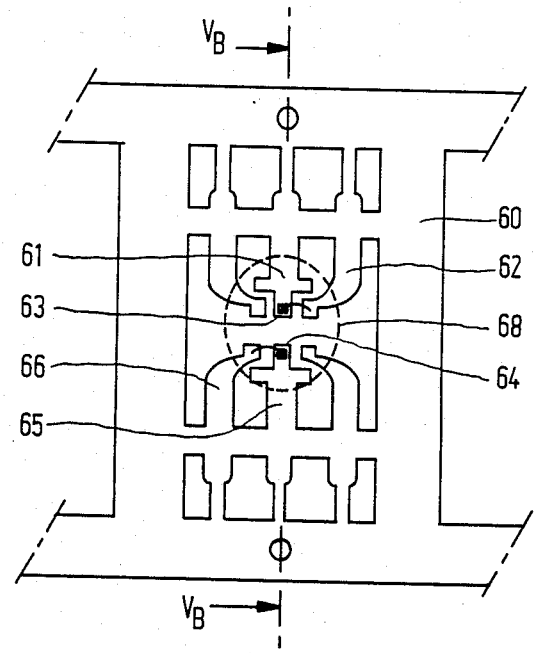
FIGS. 5A and 5B illustrate in plan view and in sectional view, respectively, another embodiment of the invention.

In FIG. 1, portion 11 of an insulating substrate is shown in sectional view carrying conductive metallic tracks 12 and 13. The assembly of the substrate 11 and of the conductive tracks 12 and 13 may be, for example, a printed circuit or a substrate of ceramic material for an electronic so-called hybrid circuit.

An electronic component 15 in the form of a semiconductor crystal is fixed and electricaly connected to the conductive track 12. An active region of the component 15 is also connected to the conductive track 13 by a wire 14. In order to protect the component 15, a drop of resin 16 of the type ethoxy bisphenol A dimethacrylate, to which is added a photo-initiator compound, is disposited on the component 15, which is enclosed, like the wire 14, by the meniscus formed by the drop of resin 16. The photoinitiator compound is of the type producing radicals by photo-scission or by intermolecular abstraction by elimination of hydrogen. It is introduced into the basic resin at a concentration lying between 0.2 and 3% by weight and preferably near 1%.

A resin of the indicated family, which is particularly well adapted to the encapsulation of electronic components is, for example, that marketed by the company AKZO Chemie under the designation "Diacryl 121".

This resin is sufficiently fluid in order that it can be used without addition of an acrylic monomer, which affords the advantage that it results in a polymerized product not very liable to break and with a minimum contraction.

A photo-initiator compound of the type producing radicals by photo-scission very suitable to be used as an addition at the dose of 1% to the said basic resin is 2-hydroxy-2-methyl-1-phenyl propane-1-one, which product is marketed by the company Merck under the designation "Darocur 1 173".

Other photo-initiator compounds may also be used as additives to the indicated basic resin, for example, a compound of the type with activation by intermolecular abstraction of hydrogen, such as benzophenone linked with an amino-acrylate, such as the product designated as P 104 and marketed by the company Union Chimique Belge.

The drop of resin is then exposed to ultraviolet radiation of moderate intensity to obtain a complete polymerization in a time of the order of 30 sec to 1 minute. A more rapid polymerization has the disadvantage that a heating of the substance is obtained, which involves the risk of inducing undesirable loads on the encapsulated electronic component.

It is often necessary to avoid the penetration of the ambient light into the component, especially when a semiconductor component is concerned. If desired, the drop of resin 16 may be covered by a suitable opaque film, which is shown in part in FIG. 1 and denoted by reference numeral 18. It should be noted that the film 18 does not play a particular role of protection outside its opacity to light and hence is not of a very critical nature. It may also be constituted by a photopolymerization resin charged with an absorbing pigment. When this film is applied with a small thickness, for example by means of a pad, the complete polymerization of this film can be obtained in spite of a high light-absorbing power.

With reference to FIG. 2, a method will be described, during which a step of precoating a device is carried out in a comparatively low volume preceding a final coating step producing the external portion of the encapsulation. FIG. 2 shows the end of two metallic conductors 21 and 22 forming part of a linear assembly of conductors (not shown) which can be assembled and which constitute a cut metallic tape known under the designation of "comb". A semiconductor crystal 24 of a light-emitting diode is fixed at the centre of a reflecting cavity 25 carried by the end of the metallic conductor 21 by means of a conductive glue according to a known technique. A conductive wire 23 also connects an active part of the crystal to the conductor 22.

A drop of resin 26 is deposited in the reflecting cavity 25 by means of a needle 27.

The volume of the drop of resin 26 is chosen so that the cavity 25 is practically filled with resin and that the semiconductor crystal 24 is covered.

According to the invention, the resin used for the precoating step is of the same nature (i.e. of the same family) and preferably the same as that used for the final coating.

The precoating resin constituted by the drop 26 deposited in the cavity 25 is then irradiated with ultra-violet radiation until a complete polymerization is obtained, which requires about 1 minute, before proceeding to the final coating.

FIGS. 3A and 3B illustrate an intermediate step, which according to the invention can be advantageously carried out before the final coating step. In these FIGS., only one pair of conductors 31, 32 corresponding to a light-emitting diode is shown, although its conductors form part of a metallic comb in multiple positions repeating several times the same elements assembled to a longitudinal tape. In a bath of photopolymerizable resin 33 a step is carried out of curing the active device 34 and a part of the conductors 31 and 32.

After contraction of the bath of resin 33, the parts of the component immersed before are covered by a comparatively thin film 35 of resin as indicated in FIG. 3B, this film then being irradiated by ultraviolet radiation until a complete polymerization is obtained. As indicated symbolically by the arrows 36, for this operation use is advantageously made of an irradiation by radiation striking the film 35 in multiple directions so as to obtain a complete polymerization of the latter after a comparatively short time of irradiation.

An important particularity of this operation resides in the fact that the boundary shown symbolically in FIG. 3B by the line 37 between the part of the conductors 31 and 32 covered by the resin film 35 and the part of the same conductors which is not covered by the said film is chosen so as to correspond very accurately to the boundary of the subsequent final coating.

Advantageously, the type of the photopolymerizable resin 33 used in the curing bath is identical to that of the resin used for the final coating.

When proceeding in this manner, it is shown that there is no noticeable discontinuity in the coating material when the component is finished at the level of the interface between the film 35 and the resin of the final coating.

The application of a comparatively thin film of resin to the parts of the component which will subsequently be coated may be complementary to the precoating step described with reference to FIG. 2 and effected thereafter. However, if desired, this application may also replace the precoating step on the condition that for, for example, a treatment in vacuo it is avoided that an air bubble is enclosed in the reflecting cavity 25 (FIG. 2), which would be detrimental especially to the optical quality of the encapsulated component. Though optional, the application of a thin film of resin described with reference to FIGS. 3A and 3B has revealed an exceptional tightness of the components thus treated during penetration tests of the solvents. More particularly, no penetration along the metallic conductors could be observed. This experimental indication is interpreted as a resultant of an excellent adhesion of the film of resin to the conductors probably favoured by a slight contraction of this film during the polymerization contraction.

With reference to FIG. 4, a method of final coating is described in which a mould is used to obtain an external part of the encapsulated which has a reproducible and controlled shape at least at certain specific parts of its contour.

Like for FIGS. 2, 3A and 3B, the embodiment shown in FIG. 4 relates to the encapsulation of a light-emitting diode comprising the metallic conductors 41 and 42 electrically connected to the semiconductor crystal 43. A mould 45 having walls practically transparent to ultra-violet light comprises a cavity 46, whose shape is to be reproduced with the finished component to be coated. The most critical part of the contour of the encapsulation is that of the optical dome 46a terminating the front side of the component, from which dome the light is emitted by the diode according to a given angular distribution with respect to the shape of this dome, which shape should be regarded with fidelity during moulding.

The material forming the mould 45 may be a polymeric material, such as polyethylene of high density or glass.

The mould 45 is provided with a given quantity of photopolymerizable resin 47 in the liquid state and the device provided with its conductors 41 and 42 is introduced into the mould and fixed in a suitable position with respect to the mould by fixing means not shown. The resin 47 is then irradiated with ultraviolet radiation through the mould 45 in a sole direction indicated by the arrows 50 so that the polymerization begins essentially along the optical dome 46a. The direction of the irradiation by ultrviolet radiation is maintained during the polymerization in such a manner that the front of polymerization 51 indicated by broken lines in the FIG. 5 is displaced in due course by a vertical translation, which ensues from the preferential direction chosen for the irradiation. When proceeding in this manner, it is found that the external contour of the coating is regard with fidelity and that the loads due to the polymerization contraction are a minimum.

Of course the method described with reference to FIG. 4, which shows a single device during coating, can be applied equally well to an operation carried out on an assembly of identical devices disposed on a comb by providing for the required number of moulds arranged linearly on a support.

It should be noted with reference to FIG. 4 that the mould 45 is not obturated at its upper part and that an initial quantity of resin 47 is provided forming a meniscus 52. This meniscus forms an excess volume of substance in the liquid state which polymerizes last of all. It is freee to provide during the process a compensation for the polymerization contraction so that at the end of the operation the meniscus 52 is replaced by a substantially flat surface. The upper part of the encapsulation from which the conductors 41 and 42 emerge is a part whose exact shape need not satisfy particular geometric requirements. Moreover, it is situated opposite to the optical dome 46a, which is in conformity with choice of the direction of irradiation by ultraviolet radiation indicated by the arrows 50.

Figure 5B:
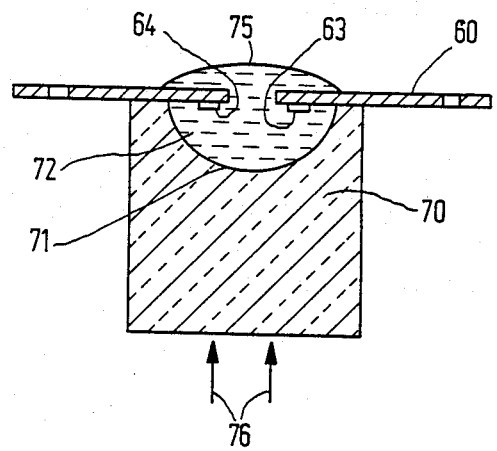

FIGS. 5A and 5B relates to the use of the method according to the invention in the case of a photocoupler.

FIG. 5A shows a position of a metallic comb 60 which comprises six conductors, whose free parts are directed towards the centre of the motive, rows of three of them each time facing each other. The crystal 63 of a light-emitting diode is fixed to the conductor 61, the junction of this diode being also connected to the conductor 62 through a wire. The semiconductor crystal 64 of a photo-detector is fixed so as to face these elements on a conductor 65 and is also connected through a wire to the conductor 66.

According to a known technique, the optical coupling between the two active semiconductor elements is obtained by placing an optical dome of suitable shape on the assembly, the light emitted by the crystal 63 of the light-emitting diode being reflected on the wall of this dome in the direction of the crystal 64 of the photodetector.

In FIG. 5A, the contour of the base of the optical dome concerned is indicated by the dotted line 68.

FIG. 5B shows a section of a comb 60 along the axis VB during an operation of moulding the optical dome by means of a photopolymerizable resin of the type already indicated.

For this purpose, a transparent mould 70 having a cavity 71 of suitable form provided beforehand with a certain quantity of resin 72 in the liquid state is placed against the comb 60.

The position of the comb 60 is such that the semiconductor crystals 63 and 64 are oriented towards the cavity 71 of the mould 70.

The quantity of resin 72 used is such that a meniscus 75 is formed above the conductors of the comb 60. An irradiation by ultraviolet light is the carried out in the direction indicated by the arrows 76 so that the polymerization begins in the proximity of the front part of the cavity 71, which is the portion of moulding whose shape should be regarded with fidelity. The polymerization is then continued substantially by translation of its front in vertical upward direction.

The meniscus 75 of still liquid resin is free to be deformed and the resin contained therein will compensate for the contraction subsequent to the polymerization. When the resin parts exposed to the ultraviolet radiation are polymerized, the mould 70 is withdrawn. If required, a supplementary irradiation with ultraviolet radiation in the direction of the upper part of the comb 60 may be used to complete the polymerization of the resin parts which have been masked against the ultraviolet radiation during the main irradiation in the direction 76.

The optical dome obtained after withdrawal of the mould is then coated with a film charged with a white pigment.

This operation may be carried out by any known technique, but also by a method analogous to that described with reference to FIG. 5B, i.e. by moulding of photosensitive resin charged by means of a mould analogous to the mould 70, but whose cavity 71 has an enlarged contour having the thickness desired for the film.

Although such a film is little transparetn to ultraviolet radiation, a suitable polymerization is nevertheless obtained because of its small thickness. Advantageously, the resin of the film formed on the optical dome is of the same nature as that used for the dome except of course for the fact that it contains a charge of a pigment, such as, for example, titanium oxide powder.

Finally, it should be noted that in the case in which an encapsulation should be formed having a defined contour, as in FIG. 5B, but the support of the active device is of the type designated in FIG. 1 by reference numeral 11, i.e. a flat support, at least one perforation is made in the support near the active device.

When then proceeding in the manner shown in FIG. 5B and when providing the cavity of the mould with an excess quantity of resin with respect to the final encapsulation volume, the volume of liquid resin which penetrates into the perforation(s) is free to be displaced during the polymerization process and progressively compensates for the reduction of volume due to the contraction of polymerization. Consequently, a suitable perforation diameter is chosen in such a manner that the excess volume of liquid resin it can contain at the initial state of the operation is sufficient.

What is claimed is:

1. A method of encapsulating an electronic component comprising an active device connected to metallic electrical conductors, said method comprising coating said component with an ultraviolet radiation polymerizable coating composition comprising an ethoxy bisphenol A dimethacrylate and about 0.2%–3% by weight of a photo-initiator compound, capable of producing radicals by photo-scission or by intermolecular abstraction of hydrogen, in a manner so as to allow each of said conductors to be partially uncoated, and exposing the thus coated component to ultraviolet radiation to thereby polymerize said coating.

2. A method as claimed in claim 1, in which a mould is used to obtain an external part of the encapsulation having a controlled and reproducible shape at least at certain desired parts of its contour, characterized in that mould used has walls practically transparent to the ultraviolet light, and in that, after having beeen fixed in respective suitable positions the device provided with its conductors and the mould provided with a suitable quantity of resin, the resin is irradiated with ultraviolet radiation through the mould in a preferential direction chosen to initiate the polymerization on the external part of the contour of the encapsulation, the shape of which is carefully controlled which conditions are maintained so that a front of progressive polymerization is displaced within the resin by translation in said preferential direction.

3. A method as claimed in claim 2, characterized in that apart from the said external part of the contour of the encapsulation, whose shape should be carefully controlled and substantially opposite thereto an excess volume of resin is provided with respect to the volume represented by the encapsulation in the polymerized state, and in that this excess volume is maintained so as to be free to be displaced during the polymerization process so as to compensate due to the contraction of polymerization for the progressive reduction of the overall volume of the resin.

4. The method of encapsulating an electronic component of claim 1 comprisisng applying directly to said component a precoating of said coating composition, irradiating said precoating with ultraviolet radiation to thereby polymerize said precoating and then applying at least on additional layer of said coating composition to said polymerized precoating and exposing said additional layer to ultraviolet radiation to polymerize said additional layer.

5. A method as claimed in claim 4, characterized in that before the final coating step a comparatively thin film of photopolymerizable resin of the same nature is applied to the device and the parts of the conductors which will also be subsequently covered by the final coating, and in that the said film is irradiated with ultraviolet radiation until it is completely polymerized before proceeding to the final coating.

6. The method of claim 1 wherein the electronic component is an optoelectronic semiconductor device.

* * * * *